United States Patent
Finney (10) Patent No.: US 9,929,150 B2
(45) Date of Patent: Mar. 27, 2018

(54) POLYSILICON DIODE BANDGAP REFERENCE

(75) Inventor: Adrian Finney, Villach (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 13/570,446

(22) Filed: Aug. 9, 2012

(65) Prior Publication Data

US 2014/0043096 A1 Feb. 13, 2014

(51) Int. Cl.
*H01L 27/08* (2006.01)
*H01L 29/861* (2006.01)

(52) U.S. Cl.
CPC ...... *H01L 27/0814* (2013.01); *H01L 29/8611* (2013.01)

(58) Field of Classification Search
CPC .......................... H01L 27/0814; H01L 29/8611
USPC ......................................... 257/601, 656, 655
See application file for complete search history.

(56) References Cited

U.S. PATENT DOCUMENTS

| | | | | |
|---|---|---|---|---|
| 3,254,275 A | * | 5/1966 | Lob | H01L 21/00 148/33 |
| 5,736,779 A | * | 4/1998 | Kobayashi | H01L 27/0255 257/355 |
| 8,704,578 B2 | * | 4/2014 | Kurokawa | H01L 27/0266 327/309 |
| 2007/0099326 A1 | * | 5/2007 | Hsu et al. | 438/48 |
| 2010/0166229 A1 | * | 7/2010 | Pennock et al. | 381/122 |
| 2010/0283530 A1 | * | 11/2010 | Zimlich | 327/513 |

OTHER PUBLICATIONS

Karnik et al, Lateral Polysilicon p+-p-n+ and p+-n-n+ diodes, 2003,Solid-State Electronics 47, pp. 653-659.*
Karnik et al, Polysilicon Diodes as Temperature Sensors for Chemical Microreaction Systems,2001, Semiconductor Device Research Symposium, pp. 174-177.*
Office Action, in the Chinese language, from counterpart Chinese Application No. 201310347338.X, dated Dec. 4, 2015, 10 pp.

* cited by examiner

*Primary Examiner* — Jose R Diaz
(74) *Attorney, Agent, or Firm* — Shumaker & Sieffert, P.A.

(57) ABSTRACT

Representative implementations of devices and techniques provide a bandgap reference voltage using at least one polysilicon diode and no silicon diodes. The polysilicon diode is comprised of three portions, a lightly doped portion flanked by a more heavily doped portion on each end.

18 Claims, 8 Drawing Sheets

POLYSILICON DIODE BANDGAP REFERENCE

BACKGROUND

Production costs may be reduced for high-volume semiconductor manufacturing when on-chip devices are limited to those necessary for the application(s) intended. In other words, the library of devices formed on a chip during manufacturing may be reduced to a limited set of device types or device families. Among other issues, this avoids unnecessary wafer processing and device library support costs. Significant high-volume production cost savings may be anticipated by elimination of at least these expenses.

One consequence of a restricted or limited device library is that general purpose circuit solutions may not always be available for use. For example, some devices may not be available for assembling common circuits, using the devices in the library. Common circuit designs may need to be modified to include the devices of the limited device library, instead of other more commonly used devices, for example. However, this is not always desirable, particularly when the available library devices have performance specifications that are less suited to the application(s).

Some solutions have included adding devices to the on-chip device library that have the performance characteristics desired. This can add wafer processing costs and device library support costs, such as the addition of layers, materials, implants, processes, and the like, that would otherwise not be used with the limited device library. Accordingly, the additional devices can increase the production costs. Other solutions have included producing circuits with the existing library of devices at reduced performance. For example, less accurate devices may be used to form less accurate circuits. While this lowers production costs, it also restricts the applications of the devices and circuits to those with wider tolerances and less dependence on accuracy. This reduces the usefulness of the devices and circuits, and may minimize the value in producing them.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Reduced on-chip device libraries are desirable, since they result in lower production costs for high-volume semiconductor devices. However, the reduced device library is less desirable if it is implemented at the expense of device or circuit performance. A combination of a reduced device library at a low cost with desired device performance is preferred.

For example, devices used to form protection circuits for metal-oxide semiconductor field-effect transistor (MOSFET) switches may be produced on the same chip as the MOSFET switches, using one or more existing process steps used to produce the MOSFET devices on the chip. Producing the protection circuit devices, for example, in this manner reduces the production costs of the chip, which is desirable as long as the protection circuit devices have adequate performance.

Representative implementations of devices and techniques provide a bandgap reference voltage using at least one polysilicon diode. In an implementation, one or more polysilicon diodes are used as a bipolar element in the bandgap reference circuit. In various implementations, the bandgap reference circuit may be used to protect the low-side of a power transistor switch, such as a MOSFET device, for example. In various other implementations, the bandgap reference circuit may be used to form a temperature sensor circuit. In an implementation, no silicon diodes are used in the bandgap reference circuit, reducing the on-chip device library.

In one implementation, the polysilicon diode(s) are comprised of three portions: a lightly doped portion flanked by a more heavily doped portion on each end. The three-portion polysilicon diode results in higher performance characteristics, including a low leakage current and a high reverse breakdown voltage.

In an implementation, the polysilicon diode(s) are formed using one or more existing portions or extended regions of on-chip power transistors. In one example, a polysilicon diode is formed using a polysilicon gate region of an on-chip power transistor. In another implementation, the polysilicon diode(s) are formed using one or more existing processes used for forming portions of on-chip power transistors. For example, a polysilicon diode may be formed, at least in part, with a process for forming a body contact region, a gate region, or a source region of an on-chip power transistor.

Various implementations and arrangements for a bandgap reference circuit and a polysilicon diode are discussed in this disclosure. Techniques and devices are discussed with reference to example vertical-channel metal-oxide-semiconductor field-effect transistor (MOSFET) devices. However, this is not intended to be limiting, and is for ease of discussion and illustrative convenience. The techniques and devices discussed may be applied to any of various transistor device designs, structures, and the like (e.g., diffusion or double-diffused metal-oxide-semiconductor (DMOS), metal-insulator-semiconductor FET (MISFET), metal-semiconductor FET (MESFET), insulated-gate FET (IGFET), high-electron mobility transistor (HEMT) or (HFET), modulation-doped FET (MODFET), HITFET, etc.), and remain within the scope of the disclosure.

Further, the techniques and devices discussed may be applied to any of various diode or diode-like semiconductor devices, various circuit designs, structures, materials, and the like, and remain within the scope of the disclosure.

Implementations are explained in more detail below using a plurality of examples. Although various implementations and examples are discussed here and below, further implementations and examples may be possible by combining the features and elements of individual implementations and examples.

Example Device Library Arrangement

Figure 1:
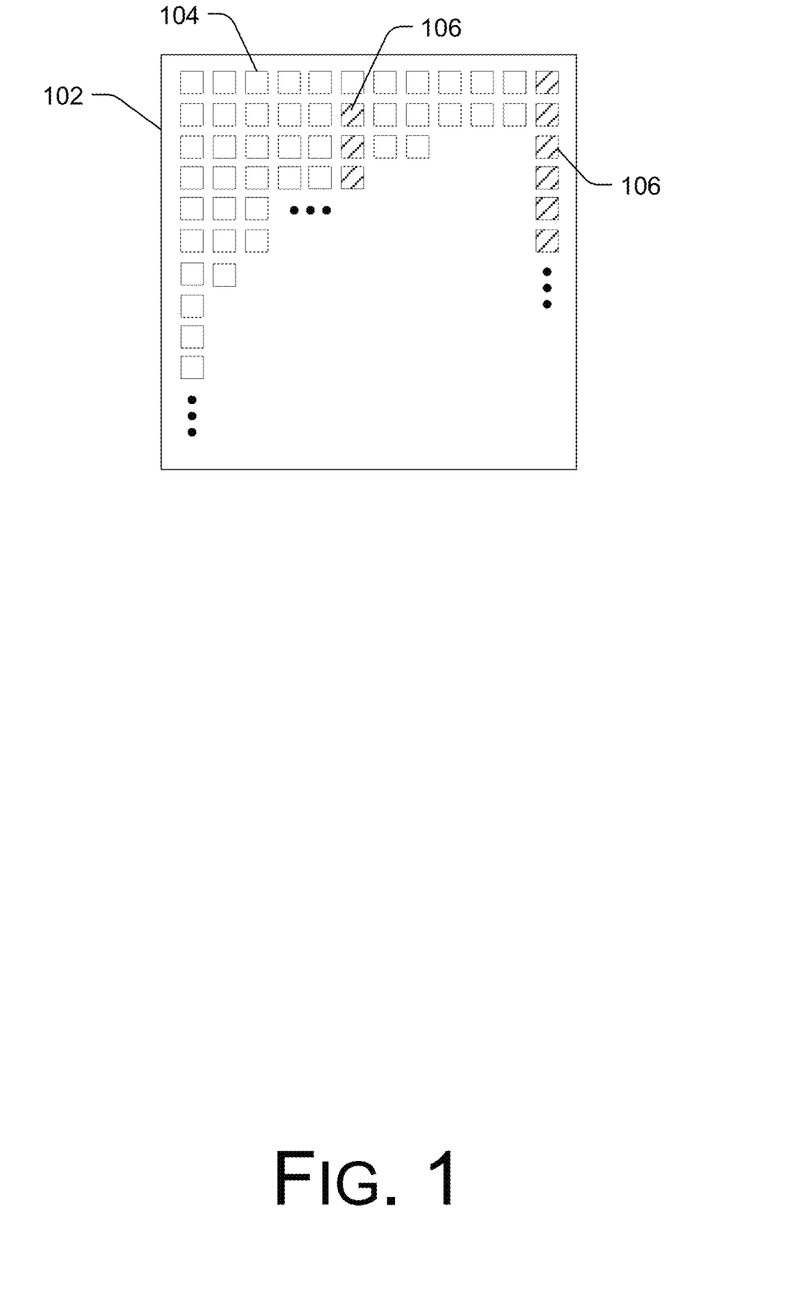
FIG. 1 is an illustration of an example semiconductor chip, including several example on-chip devices, according to an implementation.

FIG. 1 is an illustration of an example semiconductor chip 102, including several example devices (104, 106), according to an implementation. The example semiconductor chip 102 illustrates an example device library arrangement. The techniques, components, and devices described herein with respect to the semiconductor chip 102 are not limited to the illustration in FIG. 1, and may be applied to other semiconductor chip designs without departing from the scope of the disclosure. In some cases, additional or alternative components may be used to implement the techniques described herein.

The illustrated semiconductor chip 102 in FIG. 1 is shown and described as including one or more semiconductor devices (104, 106). The arrangement of the devices 104, 106) in the illustration of FIG. 1 is for illustration, and not intended to be limiting. In various implementations, devices 104 and 106 may be arranged differently. For example, devices 104 and 106 may be arranged in a pattern on the semiconductor chip 102, they may be randomly arranged, or they may be arranged in combinations of random and patterned arrangements.

In one implementation, the devices (104, 106) are arranged on the semiconductor chip 102 to facilitate connection of various devices or to form one or more circuits. In another implementation, the devices (104, 106) are arranged on the semiconductor chip 102 based on convenience in forming the devices (104, 106) on the chip 102. For example, in various implementations, a portion of one of the devices (104, 106) may be shared or continuous with a portion of another of the devices (104, 106).

In one implementation, a device 104 comprises a power transistor device (e.g., a MOSFET, DMOS, etc.) having a source or emitter region, a drain or collector region, and a gate or base structure. In alternate implementations, a device 104 may include any of various other transistors or similar semiconductor devices, and the like.

In an implementation, a device 106 includes a diode, such as a polysilicon diode, having two or more portions or regions. In alternate implementations, a diode 106 may be comprised of various types of semiconductor materials. In some implementations, one or more of the portions or regions of the diode 106 is shared or is continuous with one or more of the source region, drain region, or gate structure of the device 104.

In various implementations, a semiconductor chip 102 may include any number of devices (104, 106). In further implementations, a semiconductor chip 102 may include additional devices, circuits, structures, and the like. For example, the device library of the semiconductor chip 102 may include various devices to complete one or more circuits, systems, etc., such as a bandgap reference voltage circuit, a switch protection circuit, a temperature sensor circuit, and the like. The on-chip device library may include all of the devices for forming a circuit on a single chip, or the devices may be distributed on two or more semiconductor chips 102.

In an implementation, the manufacturing processes used to produce the devices 104 also determine the rest of the device library, including the diodes 106. For example, one or more processes used to produce power transistor devices 104 (e.g., MOSFET, DMOS, etc.) may also be used to produce other devices of the device library, such as the diodes 106. In an implementation, the processes used to form polysilicon gates on power transistors 104 are also used to form polysilicon diodes 106. For example, in one implementation, the diodes 106 in the device library are polysilicon diodes 106, based on the existing transistor processes, rather than silicon diodes, which would require one or more extra processes to form them on the semiconductor chip 102.

In alternate implementations, a semiconductor chip 102 may include alternate or additional components, and the like.

Example Diodes

Figure 2:
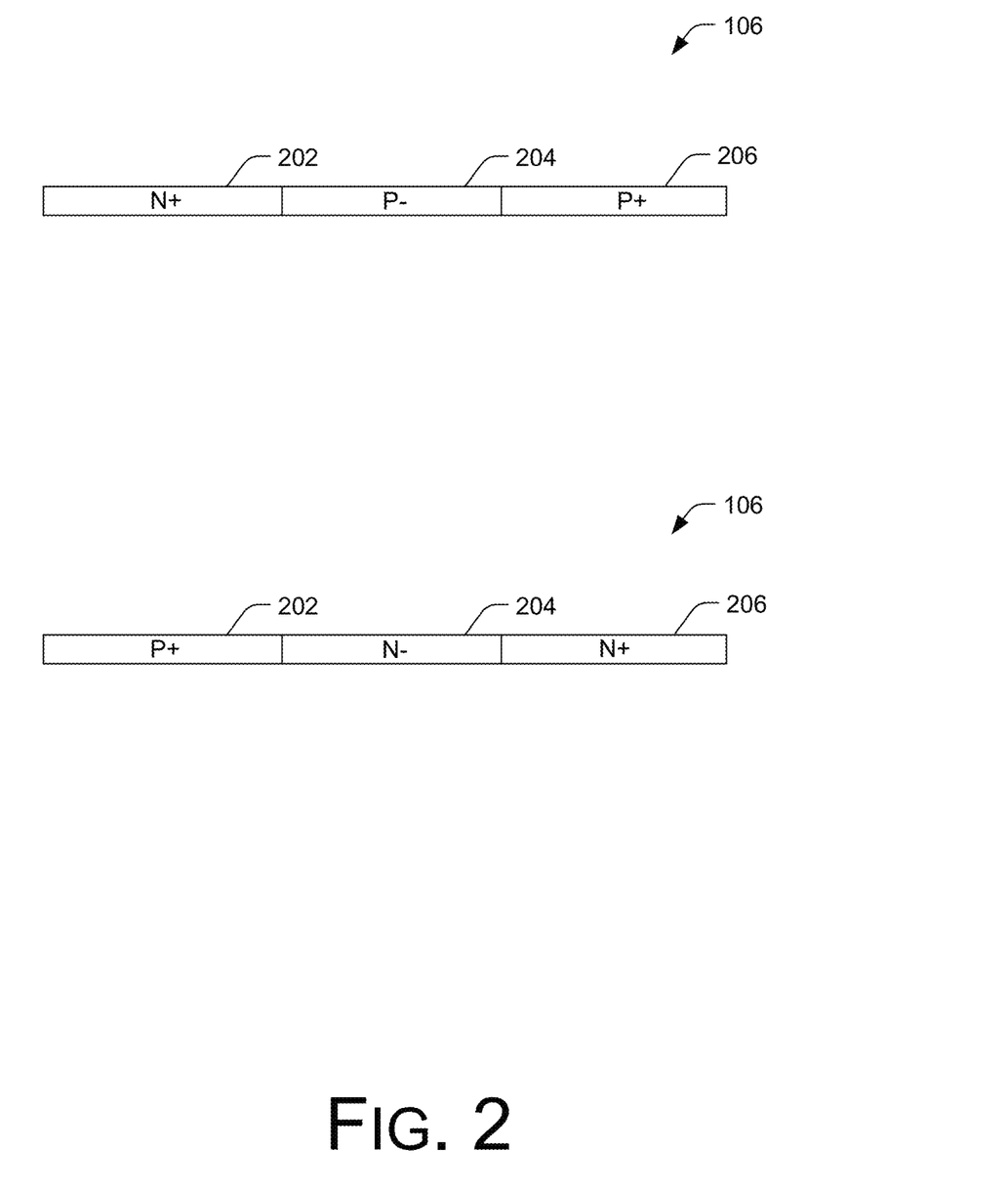
FIG. 2 is an illustration showing two examples of three-portion semiconductor diodes, according to two implementations.

In various implementations, the semiconductor diodes 106 may comprise three or more portions or regions, where each portion is adjacent to at least one other portion. FIG. 2 is an illustration showing two examples of three-portion semiconductor diodes 106, according to two implementations. In other implementations, a diode 106 may have other combinations and/or arrangements.

As shown in FIG. 2, each of the three portions of a diode 106, for example, is characterized by a different doping type and/or doping concentration. In various implementations, each of the portions or regions of the diode 106 may comprise a p-type or an n-type semiconductor material. In an implementation, the outer portions (202, 206) at either end of the diode 106 may comprise the opposite type of semiconductor material. Further, the center portion 204 may comprise the same type of semiconductor material as one of the outer portions (202, 206), but have a lighter or lesser doping characteristic than one or both of the outer portions (202, 206).

For example, as shown in FIG. 2, a three-portion diode 106 may have a doping construction or doping arrangement of N+/P−/P+ or P+/N−/N+. In various alternate implementations, a three-portion diode 106 may have other doping arrangements or constructions. Further, in other implementations, four-portion diodes, and diodes 106 with a greater number of portions may be arranged and/or constructed.

In an implementation, as shown in FIG. 2, the outer portions (202, 206) may be more heavily doped than the center portion (204). In the example, the center portion (204) reduces the electric field across the semiconductor junction, resulting in lower forward and reverse biased leakage currents and a higher reverse breakdown voltage of the diode 106.

In various implementations, the length or area of each of the portions of the polysilicon diode 106 may vary. For example, in some implementations, the center portion 204 may be much shorter or smaller than the outer portions (202, 206). In other implementations, the center portion 204 may be substantially close in length, size, or area to the outer portions (202, 206). In alternate implementations, the length, size, or area of each of the portions (202, 204, 206) of the polysilicon diode 106 may be designed based on the desired performance of the diode 106 (e.g., resistance, leakage current, current and/or breakdown voltage capacity, etc.).

In one implementation, the diode 106 is at least partly comprised of polysilicon. For example, at least one of the first (202), second (204), and third (206) portions of the diode 106 comprise a polysilicon material. In an implementation, the three-portion arrangement of the diode 106, as discussed above, improves the performance of the polysilicon diode 106, by reducing the forward and/or reverse biased leakage currents and increasing the reverse biased breakdown voltage of the polysilicon diode 106.

In an implementation, at least one of the outer portions (202, 206) of a diode 106 is continuous with a source region, gate region, or a body region of a power transistor device 104. In a further implementation, the center portion (204) of a diode 106 is continuous with a gate region of a power transistor or circuit device 104 (e.g., DMOS, NMOSFET, PMOSFET etc.). Such devices may be formed with either N+ type or P+ type polysilicon gates which may also form part of a polysilicon diode 106. In an alternate implementation, the center portion (204) of the diode 106 is continuous with another region of the transistor device 104. In various implementations, portions of a diode 106 may be shared or continuous with other portions of other devices of an on-chip device library and remain within the scope of the disclosure.

Example Implementations

Figure 3:
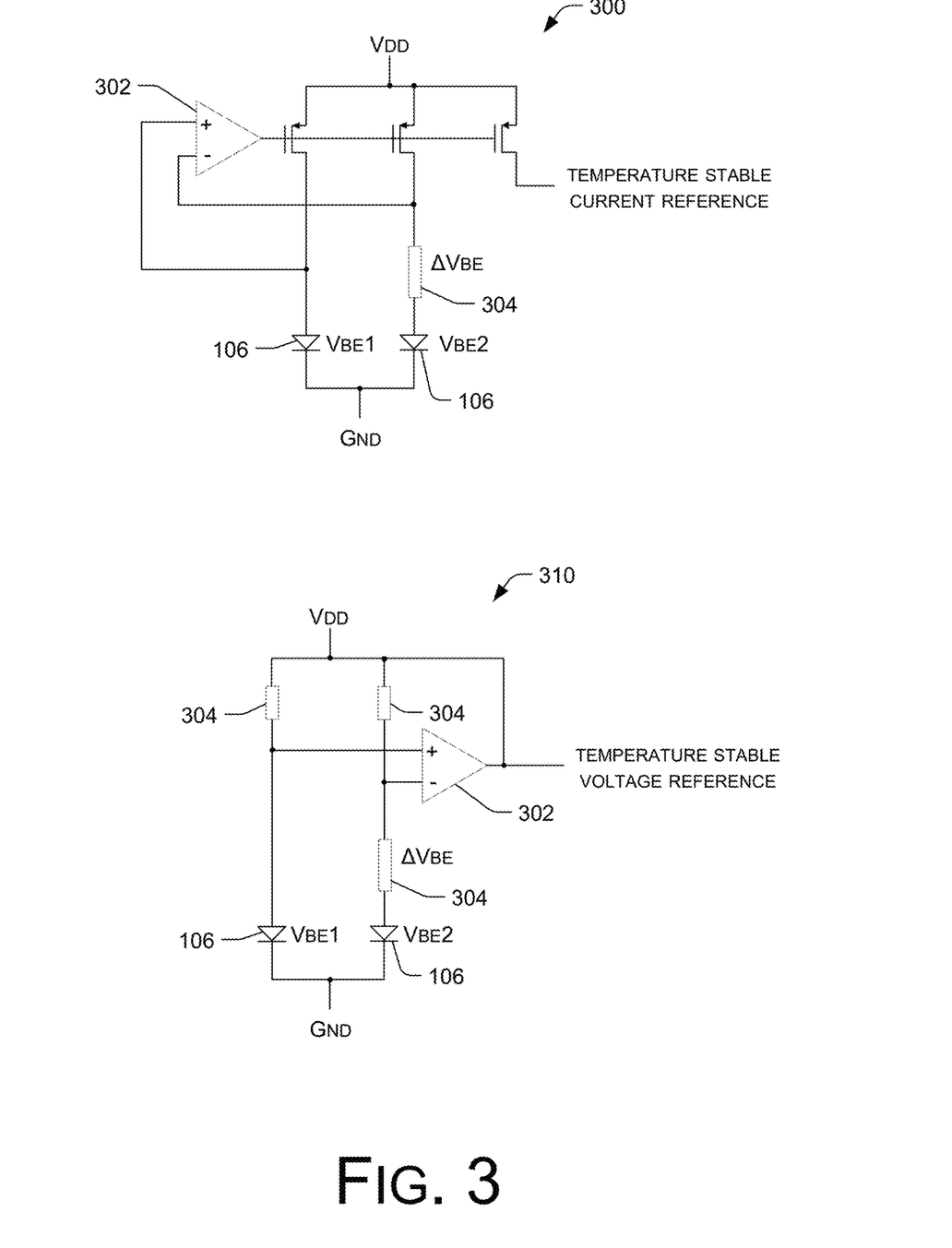
FIG. 3 shows two schematic drawings of example electrical circuits including a bandgap voltage reference core, according to example implementations.

FIG. 3 shows two schematic drawings of example electrical circuits (300, 310) including a bandgap voltage reference ΔVbe core, according to example implementations. The drawings show a temperature stable current reference circuit 300 and a temperature stable voltage reference circuit 310. The two drawings are examples for discussion purposes and in alternate implementations, various other circuit types and circuit configurations are within the scope of the disclosure.

The illustrations of FIG. 3 show two polysilicon diodes 106 in each circuit 300, 310 for discussion purposes. In various implementations, one or more polysilicon diodes 106 are used to provide the bandgap voltage for the circuit 300, 310. In one implementation, the circuit 300, 310 is formed from an on-chip device library of a single semiconductor chip 102, for example. In an implementation, no silicon bipolar devices are used in the electrical circuit 300, 310 or included with the semiconductor chip 102, thus reducing the on-chip device library.

In an implementation, the one or more polysilicon diodes 106 included in the circuits 300, 310 are comprised of three or more portions, as described above with reference to FIG. 2. For example, the one or more polysilicon diodes 106 may include a first portion having a first type of doping, a second portion adjacent to the first portion and having a second type of doping, and a third portion adjacent to the second portion having the second type of doping. In an implementation, the third portion and/or the first portion are more heavily doped than the second portion. In an implementation, the use of polysilicon diodes 106 with three or more portions improves the performance of the polysilicon diodes 106 (e.g., lower forward and reverse leakage currents, higher reverse breakdown voltages, etc.).

In an implementation, as described above, at least one of the first, second, or third portions of the one or more polysilicon diodes 106 is formed from a body region, a gate region, or a source region of a metal-oxide-semiconductor field effect transistor device.

Figure 4:
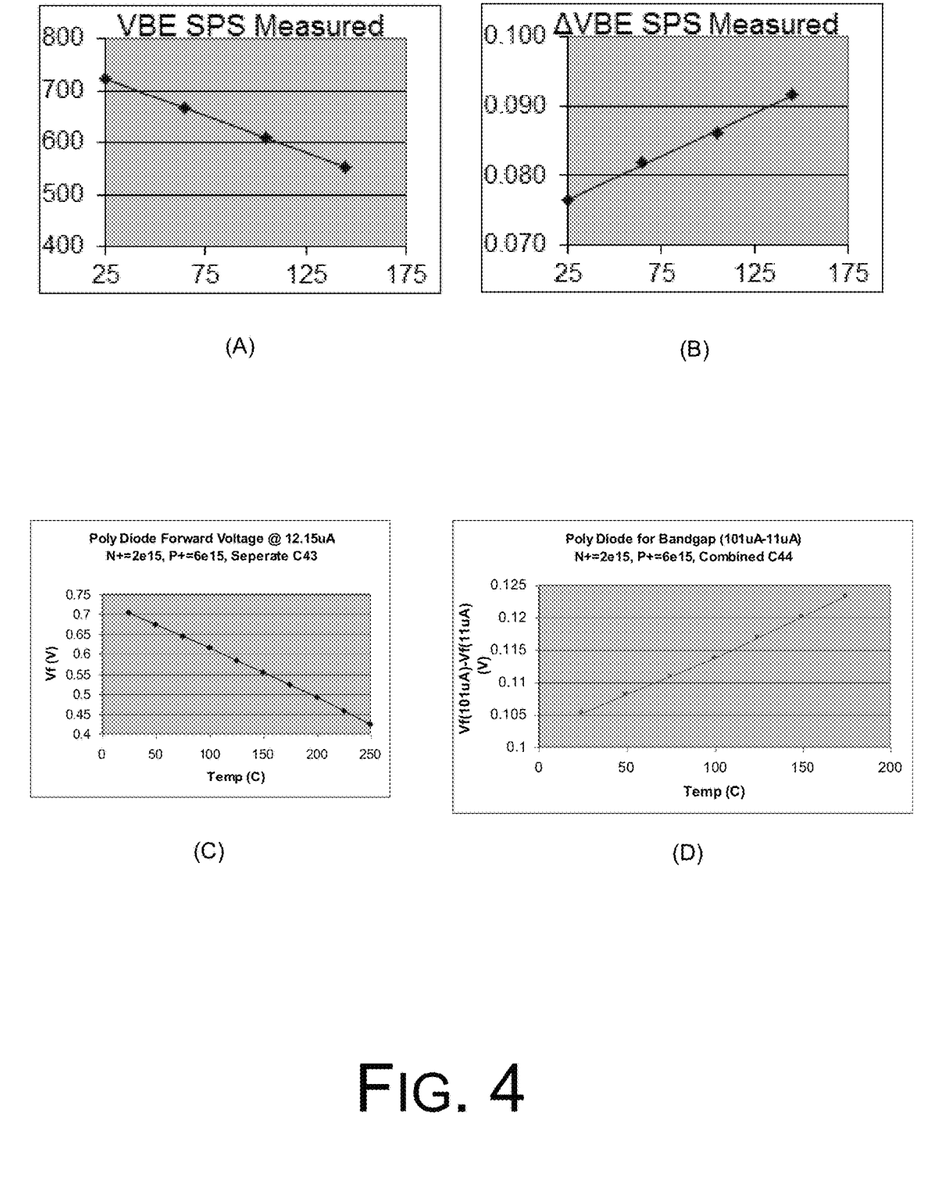
FIG. 4 shows two sets of graphs, illustrating example temperature coefficients of example diode characteristics, according to two implementations.

In an implementation, a single polysilicon diode 106 included in the circuit 300, 310 may be arranged to operate at two different current densities, with forward biases Vbe1 and Vbe2 resulting from the different current densities. A forward voltage Vbe at any single current density has a negative temperature coefficient. This effect is shown in FIG. 4, at (A) and (C). However the difference between the two forward voltages Vbe1 and Vbe2 is called the bandgap voltage ΔVbe=Vbe1−Vbe2 which has a positive temperature coefficient as shown in FIG. 4, at (B) and (D).

In an alternative implementation, as shown in the circuits of FIG. 3, two polysilicon diodes 106 may be included in the circuit 300, 310 and arranged to operate at different current densities. In one implementation, the first polysilicon diode 106 and the second polysilicon diode 106 may have substantially different physical characteristics (e.g., area, dimensions, etc.). For example, in an implementation, the second polysilicon diode 106 may have a substantially greater physical area than the first polysilicon diode 106. Alternatively, in a further implementation, the two polysilicon diodes 106 may be physically identical but operated at different currents, which also results in different current densities.

In the alternative implementation, forward voltages Vbe1 and Vbe2 are forward biases associated with the first and second polysilicon diodes 106, resulting from the respective current densities of the diodes 106. The forward voltages Vbe1 and Vbe2 have negative temperature coefficients, as mentioned above. This effect is shown in FIG. 4, at (A) and (C).

The bandgap voltage (ΔVbe) is the measured difference in potential between the forward biased voltages Vbe1 and Vbe2 of the first and second polysilicon diodes 106 at their respective current densities. The bandgap voltage ΔVbe has a positive temperature coefficient as mentioned above, and as shown in FIG. 4, at (B) and (D).

In an implementation, a bandgap reference circuit 300, 310, with either a single or multiple diode configuration, combines the positive temperature coefficient of the ΔVbe voltage described above with the negative temperature coefficient of a single Vbe measurement (e.g., a forward voltage Vbe of either the first polysilicon diode or the second polysilicon diode operating at their respective current densities or a single polysilicon diode operating at a single current density), in the correct ratio, to generate a substantially temperature independent reference current (in the case of circuit 300) or reference voltage (in the case of circuit 310). In various implementations, as shown in the examples of FIG. 3, the circuit 300 is arranged to output a reference current at one or more outputs of the circuit 300 and the circuit 310 is arranged to output a reference voltage at one or more outputs of the circuit 310. In alternate implementations, the reference values may be used to provide a reference to one or more portions of a system, module, circuit, or the like.

In some implementations, the circuit 300, 310 may include an operational amplifier 302 and one or more impedances 304, as well as other devices. If included, the operational amplifier 302 may use feedback to force a constant current through the two polysilicon diodes 106. The constant current supplies the current densities to the two polysilicon diodes 106, to provide the Vbe measurements at each of the polysilicon diodes 106.

In various implementations, the circuit 300, 310 may include one or more impedances 304 to allow the circuit to achieve its operating point.

In one implementation, an electrical circuit (such as electrical circuit 300, 310, etc.) is arranged to include two polysilicon diodes, and is operated as a ΔVbe or bandgap temperature sensor circuit. In the implementation, two polysilicon diodes 106 having a substantially identical design (i.e., substantially identical operating characteristics) are operated in the forward direction at different current densities. Alternately, as described above, a single polysilicon diode 106 may be used, and operated sequentially at two different currents.

The forward voltage Vbe is measured at each of the two polysilicon diodes 106 (or at the single diode 106 at each of the two currents). The potential difference or bandgap voltage ΔVbe generated between the two Vbe measurements has a positive temperature coefficient, and is more accurate than the temperature coefficient of a single diode 106, because the combination matches out most of the diode manufacturing variations.

In an implementation, the temperature sensor circuit operates according to the following formula:

$$\Delta V_{BE} = \frac{KT}{q} \cdot \ln\left(\frac{I_{C1}}{I_{C2}}\right)$$

where K is the Boltzmann's constant, T is the temperature in Kelvin, q is the charge on an electron, and $I_{C1}$ and $I_{C2}$ are the two different currents through the two polysilicon diodes 106.

In various implementations, additional or alternative components may be used to accomplish the disclosed techniques and arrangements.

Representative Processes

Figure 5:
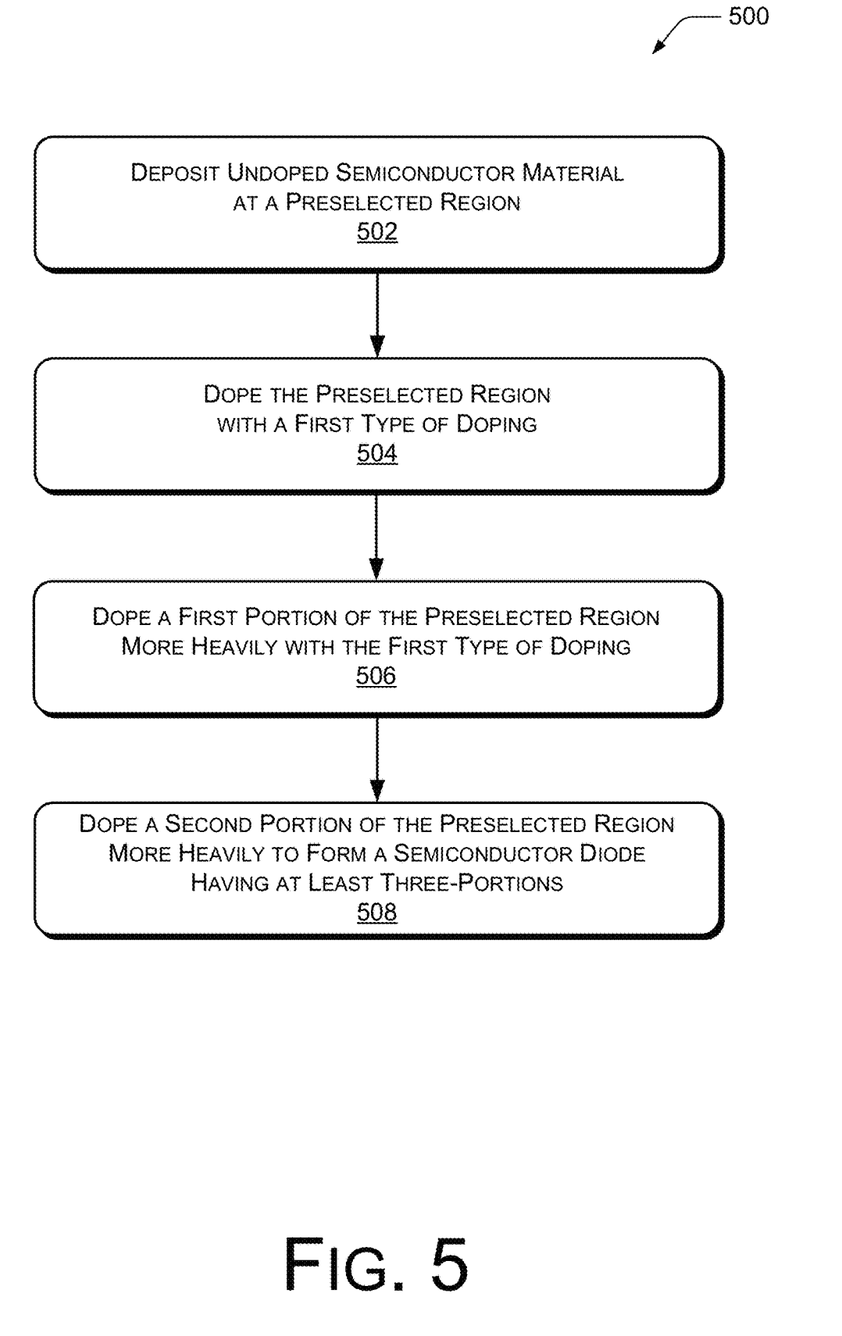
FIG. 5 is a flow diagram illustrating an example process for forming a three-portion diode, according to an implementation.
Figure 6:
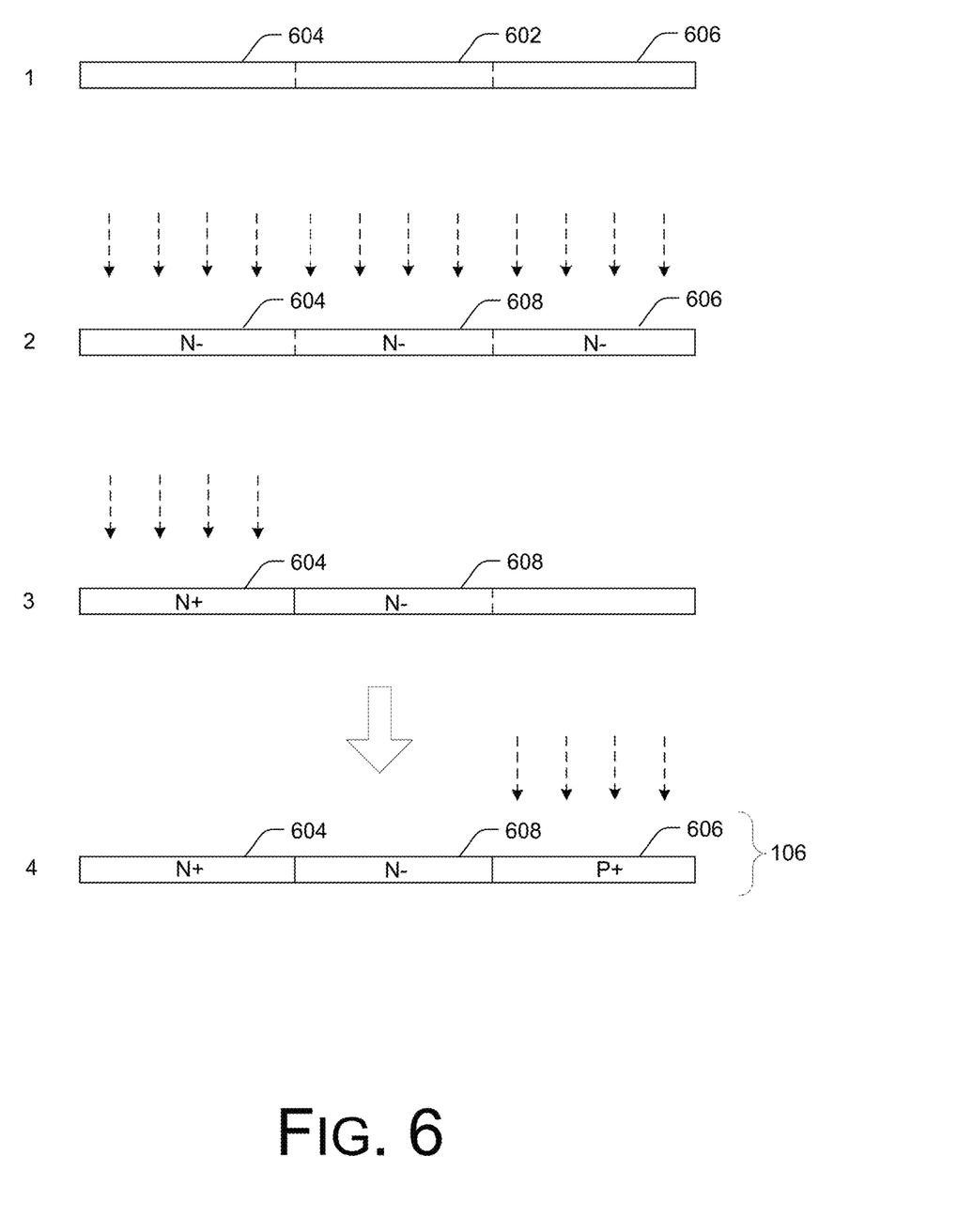
FIG. 6 is an illustration of an example process for forming a three-portion diode, according to an implementation.
Figure 7:
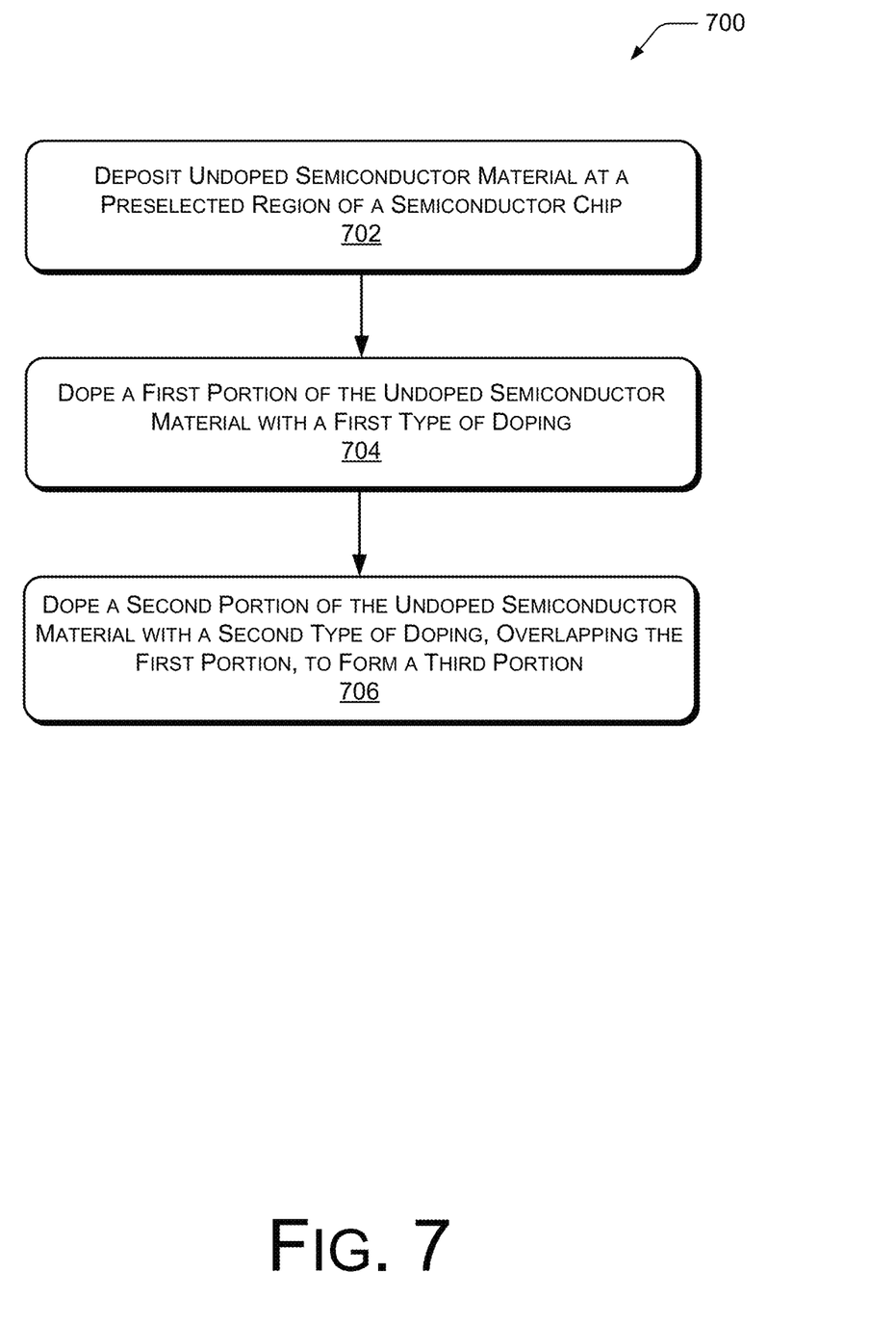
FIG. 7 is a flow diagram illustrating another example process for forming a three-portion diode, according to another implementation.
Figure 8:
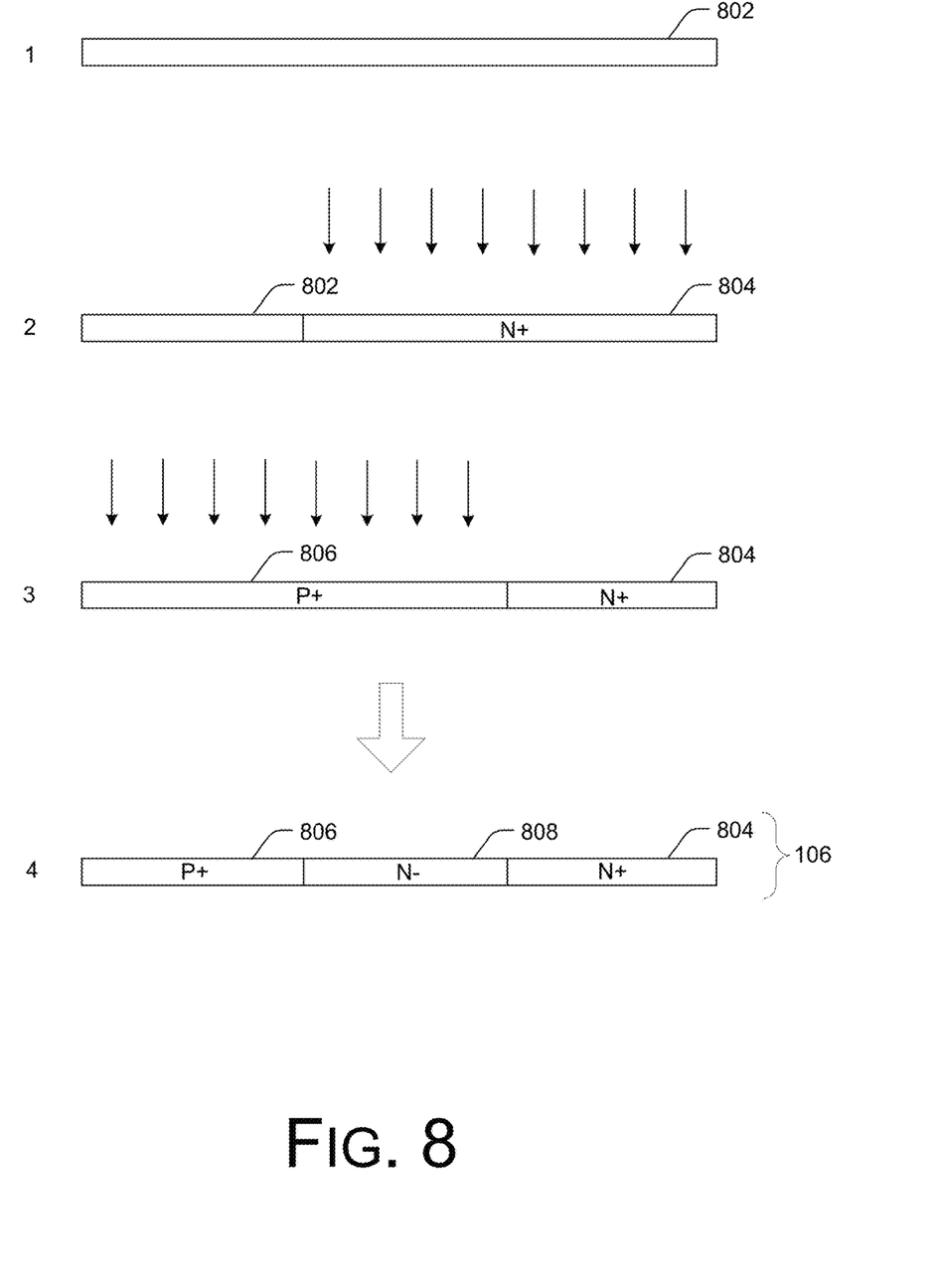
FIG. 8 is an illustration of another example process for forming a three-portion diode, according to another implementation.

FIGS. 5 and 7 illustrate representative processes 500 and 700 for forming a three-portion semiconductor diode (such as diode 106, for example) on a semiconductor chip or wafer (such as semiconductor chip 102, for example). In various implementations, the diode may be used in a bandgap reference circuit (such as circuit 300, 310, for example). In some implementations, one or more portions of the diode 106 comprise a polysilicon material. FIG. 6 illustrates the example process 500 and FIG. 8 illustrates the example process 700. The processes 500 and 700 are also described with reference to FIGS. 1-4.

The order in which the processes are described is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the processes can be implemented in any suitable materials, or combinations thereof, without departing from the scope of the subject matter described herein.

Referring to FIG. 5, at block 502, the process 500 includes depositing undoped semiconductor material at a preselected region. In an implementation, the preselected region may include a portion whereupon one or more transistors or transistor components, or the like, are formed. In an implementation, the undoped semiconductor material comprises a polysilicon material.

At block 504, the process 500 includes doping the preselected region with a first type of doping. For example, in an implementation, the process includes lightly doping throughout the preselected area with an N− doping.

At block 506, the process 500 includes doping a first portion (portion 604 of FIG. 6, for example) of the preselected region more heavily with the first type of doping. For example, in the implementation, the process includes doping the first portion of the preselected area (e.g., a portion at one of the outer edges such as 604) with the first type of doping (e.g., n-type) at a higher concentration than the doping at block 504.

At block 508, the process 500 includes doping a second portion of the preselected region more heavily with a second type of doping, to form a semiconductor diode having at least three adjacent portions, including the first portion, an intermediate portion, and the second portion. For example, referring to FIG. 6, the process includes doping the second portion (portion 606 of FIG. 6, for example) of the preselected area with the second type of doping (e.g., p-type) at a higher concentration than the doping at block 504. In other words, the first and second portions are doped at concentrations capable of overdoping the initial light (N−) doping of the semiconductor material.

As shown in FIG. 6, the process 500 results in a three-portion diode (106). In an implementation, the process 500 includes doping the intermediate portion with the first type of doping at a lesser magnitude of doping than a doping of the first portion or a doping of the second portion. For example, referring to FIG. 6, the N− center region 608 is doped to a lesser degree (e.g., is relatively lighter doped) than the P+ first portion 604 or the N+ third portion 606.

In another implementation, the undoped semiconductor material comprises a polysilicon material. The process 500 includes depositing the polysilicon material to concurrently form a gate of a power transistor (such as transistor 104, for example) and to form a part of the three-portion polysilicon diode. For example, an existing process of forming a gate region of a power transistor may also be used to form part of the diode 106 (shown in FIG. 6). In one implementation, the gate region of the transistor and the diode share common areas or are continuous.

In one implementation, the process 500 includes implanting the first portion with the first type of doping to form a body contact region of a power transistor, and implanting the second portion with the second type of doping to form a source region of the power transistor. For example, the process 500 includes using a process to form a portion of a power transistor and to concurrently form a portion of a diode. This is shown with the dashed arrows in FIG. 6.

In one implementation, the first portion comprises an existing body contact region of an existing transistor device, and the second portion comprises an existing source region of the existing transistor device. For example, in one implementation, one or more portions of the diode are shared or continuous with one or more of the body contact region, the gate region, and the source region of a transistor device. In one implementation, one or more portions of the preselected region comprises a gate region of an existing power transistor and/or circuit transistor device.

In an implementation, the process 500 includes forming a second semiconductor diode having substantially identical performance characteristics to the first semiconductor diode, and forming a bandgap reference voltage source based on a combination of a bandgap voltage generated from the first semiconductor diode operating at a first current density and the second semiconductor diode operating at a second current density, with a forward voltage of the second semiconductor diode operating at the second current density. In an alternate implementation, the bandgap reference voltage source is based on a combination of the bandgap voltage and a forward voltage of the first semiconductor diode operating at the first current density.

For example, a bandgap reference voltage circuit (such as circuit 300, for example) may be formed using one or more polysilicon diodes, as discussed above. A second polysilicon diode may be formed that has different physical characteristics (e.g., dimensions, area, etc.) from the first diode, but has substantially identical performance characteristics (e.g., matching operational characteristics). The first and second polysilicon diodes may be the core of the bandgap reference voltage circuit.

In one example, a graph showing a negative temperature coefficient of a forward voltage Vbe measurement corresponding to a polysilicon diode formed with the process 500 is shown in FIG. 4 at (A). The corresponding positive temperature coefficient graph of the bandgap voltage difference ΔVbe discussed above is shown in FIG. 4 at (B).

Referring to FIG. 7, at block 702, the process 700 includes depositing undoped semiconductor material at a preselected region of a semiconductor chip. For example, referring to FIG. 8, an undoped semiconductor material 802 is deposited at a preselected region of a semiconductor chip or wafer (such as semiconductor chip 102, for example).

At block 704, the process 700 includes doping a first portion of the undoped semiconductor material with a first type of doping at a first doping level. For example, referring to FIG. 8, a first portion (804) may be doped with an N+ doping.

At block 706, the process 700 includes doping a second portion of the undoped semiconductor material with a second type of doping at a second doping level. For example, referring to FIG. 8, a second portion (806) may be doped with a P+ doping. In one implementation, the process 700 includes doping the second portion of the undoped semiconductor material with the second type of doping more heavily than doping the first portion of the undoped semiconductor material with the first type of doping.

In an implementation, the second portion overlaps the first portion to form a third portion comprising the overlapped first portion. For example, referring to FIG. 8, the third portion (808) comprises the region where the second portion (806) overlaps the first portion (804).

In an implementation, the third portion has the second type of doping at a lighter concentration (i.e., N– doping, for example) or lesser doping level than the first doping level or the second doping level. In one implementation, this is a result of the more heavy second type of doping overlapping the less heavy first type of doping. In alternate implementations, the type of doping at the third portion may be different, based on the degree or magnitude of the first and second doping types.

In an implementation, the process of doping the first and second portions as described at blocks 704 and 706, forms a diode (such as diode 106, for example). In one implementation, the process of doping the first and second portions as described at blocks 704 and 706 also comprises at least a part of a process of forming one or more transistor devices. In other words, the diode is formed using processes for forming one or more transistors.

In an implementation, at least one of the first, second, and third portions of the formed diode comprise a polysilicon material.

In one example, a graph showing a negative temperature coefficient of a forward voltage Vbe measurement corresponding to a polysilicon diode formed with the process 700 is shown in FIG. 4 at (C). The corresponding positive temperature coefficient graph of the bandgap voltage difference ΔVbe discussed above is shown in FIG. 4 at (D).

In alternate implementations, other techniques may be included in the processes 500 and/or 700 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. An electrical circuit, comprising:
   a semiconductor chip;
   a first polysilicon diode formed on the semiconductor chip and arranged to operate at alternating current densities, the first polysilicon diode including:
      a first portion having a first type of doping at a first doping level;
      a second portion having a second type of doping at a second doping level that is different than the first doping level, the second portion adjacent to the first portion: and
      a third portion having the second type of doping at a third doping level that is different than the first and the second doping level, the third portion adjacent to the second portion and more heavily doped than the second portion;
   one or more impedances formed on the semiconductor chip, a reference voltage formed across the one or more impedances based on a bandgap voltage of the first polysilicon diode generated from operating at each of the alternating current densities;
   at least one transistor formed on the semiconductor chip and wherein a body region, a gate region, or a source region of the at least one transistor is continuous with one of the first portion, the second portion, and the third portion of the first polysilicon diode; and
   a bandgap temperature sensor circuit formed on the semiconductor chip and arranged to operate based on a temperature coefficient of the bandgap voltage.

2. The electrical circuit of claim 1, further comprising a second polysilicon diode, wherein the reference voltage is based on a bandgap voltage generated from the first polysilicon diode operating at a first current density and the second polysilicon diode operating at a second current density.

3. The electrical circuit of claim 2, wherein the bandgap reference voltage circuit is further arranged to operate based on combining a temperature coefficient of the forward voltage with a second temperature coefficient of a bandgap voltage between the first polysilicon diode operating at the first current density and the first or second polysilicon diode operating at the second current density.

4. The electrical circuit of claim 2, wherein the first polysilicon diode and the second polysilicon diode have substantially different physical characteristics and substantially equal operational characteristics.

5. The electrical circuit of claim 4, wherein the second polysilicon diode has a substantially greater physical area than the first polysilicon diode.

6. The electrical circuit of claim 2, wherein the electrical circuit is arranged to output the reference voltage at an output of the circuit.

7. The electrical circuit of claim 1, wherein the bandgap reference voltage circuit is further arranged to operate based on combining a temperature coefficient of the forward voltage with a second temperature coefficient of a bandgap voltage between the first polysilicon diode operating at the first current density and the first or second polysilicon diode operating at the second current density.

8. The electrical circuit of claim 1, wherein the electrical circuit is arranged to output the reference voltage at an output of the circuit.

9. An electrical circuit, comprising:
a semiconductor chip;
a semiconductor diode formed on the semiconductor chip, wherein the semiconductor diode comprises:
  a first portion having a first type of doping at a first doping concentration;
  a second portion having a second type of doping at a second doping concentration that is different than the first doping concentration, the second portion adjacent to the first portion; and
  a third portion having the second type of doping at a third doping concentration that is different than the first and the second doping concentration, the third portion adjacent to the second portion and more heavily doped than the second portion;
a source of current formed on the semiconductor chip, wherein the source of current is coupled to the semiconductor diode and is configured to supply a first constant current to the semiconductor diode;
at least one transistor formed on the semiconductor chip, wherein a body region, a gate region, or a source region of the at least one transistor is continuous with one of the first portion, the second portion, and the third portion of the semiconductor diode; and
a bandgap temperature sensor circuit formed on the semiconductor chip and arranged to operate based on a temperature coefficient of the bandgap voltage.

10. The electrical circuit of claim 9, wherein at least one of the first, second, and third portions comprise a polysilicon material.

11. The electrical circuit of claim 9, wherein the source of current to supply a second constant current to the semiconductor diode, the second constant current being different than the first constant current.

12. The electrical circuit of claim 9, further comprising a second semiconductor diode having substantially the same design as the semiconductor diode, and wherein the source of current is to supply a second constant current to the second semiconductor diode, the second constant current being different than the first constant current.

13. The electrical circuit of claim 9, wherein the diode doping construction comprises one of a P+/N−/N+ or a N+/P−/P+ construction.

14. The electrical circuit of claim 9, wherein the first portion is more heavily doped than the second portion.

15. The electrical circuit of claim 9, wherein the first portion and the third portion are more heavily doped than the second portion.

16. The electrical circuit of claim 9, wherein the gate region of the at least one transistor is continuous with the second portion of the semiconductor diode and comprises polysilicon.

17. The electrical circuit of claim 9, wherein the second portion has a length or area that is less than a length or area of the first portion and less than a length or area of the third portion.

18. The electrical circuit of claim 17, wherein the semiconductor diode is formed on the semiconductor chip in a grid together with a plurality of power transistors that includes the at least one transistor.

* * * * *